United States Patent Office 3,046,125

Patented July 24, 1962

3,046,125
PRINT-OUT PHOTORESISTS AND METHOD OF MAKING SAME

Eugene Wainer, Cleveland Heights, Ohio, assignor to Horizons Incorporated, Cleveland, Ohio, a corporation of New Jersey No Drawing. Filed Apr. 19, 1960, Ser. No. 23,130
10 Claims. (Cl. 96—35)

This invention relates to photoresists and to the manufacture of photoresists using compositions which are sensitive to light. More particularly, the invention relates to the production of stable print-out and developable out images produced by exposing to light and/or to light and heat, compositions whose solubility and whose characteristics in a variety of solvents are radically modified as the result of such exposure.

The compositions of matter on which this invention is based are comprised of combinations of organic amines, organic halogen-containing compounds which are sources of free radicals on exposure to light, and which may contain minor amounts of substances added for stabilization, fixing, enhancement of photographic speed, and the like, all suitably mixed and disposed in a suitable base. After deposition on a suitable surface, a pronounced differentiation in solubility in a variety of solvents is developed as a result of differential exposure to light, which differentiation did not exist prior to exposure. Said differentiation of solubility is generally enhanced by heating after exposure to light.

A wide variety of applications are available for a properly constituted photoresist. In its simplest form, the manufacture of photoresists is accomplished as follows: Photosensitive compositions are laid down on a metal surface; after exposure to light and removal of the unexposed areas with a suitable solvent, the resulting article is then etched in a solution which will dissolve away metal, and the photoresist must be capable of withstanding the chemical action of the etched material. In this way, nameplates, label plates, printed circuits, and the like are produced commercially at the present time. In a known modification of the process, multicolor effects are obtained by applying a photoresist to a dye receptive surface. After exposure to light and removal of the unexposed portions with a suitable solvent, the assembly is treated in a dye of one color. The photoresist is then stripped off and the item is again completely recoated with fresh resist and again reexposed to light in a different manner. After washing off the unexposed areas, the assembly is dyed in a different color and so on until any combination of colors desired has been laid down on the dye receptive base.

An exceptionally important application for photoresists is in the manufacture of lithographic plates. For this particular use, the simplest technique involves the application of a photoresist to a hydrophilic surface, such hydrophilic surface being casein coated paper, methyl cellulose impregnated paper, and the like. The exposure is carried out through a negative and the unexposed portions are then removed by treatment in a suitable solvent. After drying, the sheet is ready for utilization as a master plate for lithographic purposes. Usually the exposed portions are ink receptive and the hydrophilic base is ink repellent, being water receptive.

A very useful modification of the use of photoresists for the production of lithographic masters is the use of reflex techniques in photocopying to produce such a master. For this type of master, a direct positive process is required to produce a direct positive image. However, in view of the use of the reflex technique, the direct positive image reads in the wrong direction. Such a direct positive image is then transferred from one surface to another so that a right reading image is obtained. In the process of the present invention, a direct positive photoresist is produced by techniques to be described in later portions of this specification. After development with a suitable solvent, the image on a supporting plate is brought in contact with another surface soaked in a softening agent or solvent for the developed image so that after application of pressure, the image is then transferred to the second surface for reading in the proper direction for lithographic purposes. Such a practice eliminates the need for a negative in the production of lithographic plates by photographic techniques.

Principal objects of this invention are to effect a light induced reaction between organic amines and sources of halogen-containing free radicals and, usually after heating, to treat the product so obtained with a selective solvent which removes only portions of the product, leaving behind other portions defining an image deposited on a selected surface; to provide halogen-containing free radical sources in said compositions so that ranges of spectral sensitivity are available stemming from the far ultraviolet to the near ultraviolet into the visible up to the green yellow; to provide a system of solvents which makes a sharp differentiation between exposed and unexposed portions; to provide means for transferring the image thus obtained from one surface to another by means of contact procedures; to utilize the chemical reactions and compositions for all the various uses enjoyed by a properly composed photoresist; and finally, to make available a photoresist system in which, as the result of manipulation of the incident light with respect to wave length, a direct positive resist may be obtained, if desired.

In various copending United States patent applications filed by me including: Serial No. 787,112, filed January 16, 1959; Serial Nos. 841,459 and 841,460, both filed September 22, 1959; 842,569, filed September 28, 1959; and Serial Numbers 1,161 and 1,162, both filed January 8, 1960, photographic compositions are described which can be processed dry in producing a visual result on exposure to light or to a combination of light and heat which are composed of combinations of organic amines, free radical progenitors which produce halogen-containing free radicals on exposure to light, minor amounts of modifying substances, and either wax-like hydrocarbon or synthetic resin film forming bases.

The organic amines described in these copending applications fall into three general classes:

(*a*) Arylamines in which the amine nitrogen is attached to a carbocyclic nucleus; (*b*) arylamines in which the compounds include both carbocyclic and heterocyclic constituents in their structure, and; (*c*) amines of classes (*a*) and (*b*) containing a vinyl grouping in their structure in which the vinyl grouping is attached directly to the amine nitrogen. In this description, the phrase "organic amine" refers to all these various classes and combinations thereof.

Also, in the same copending applications are described varieties of organic halogen-containing compounds which release free radicals in suitable systems on exposure to light. Each of these is a halogenated hydrocarbon in which the active halogen atom is attached to a carbon to which there is attached not more than a single hydrogen atom and as specifically described in my application Serial No. 787,112, filed January 16, 1959, the activation energy of the halogen-containing free radical is the important determining factor in the suitability of the halogenated hydrocarbon for the process. It appears that in order for the halogenated hydrocarbon to be effective it must have an energy of dissociation or in other words an energy of formation of the free halogen radical of not less than 40 kilogram calories per mol. The sources of free radicals most suitable for the process of the present invention are those which permit control of spectral sensitivity. These include carbon tetraiodide, carbon tetrabromide, hexachloroethane, and tetrachlorotetrahydronaphthalene, all of which are solids at room temperature and are therefore preferred.

I have now found that selected compositions similar to those described previously for dry print-out purposes producing a visual result may also be utilized as a photoresist by use of selected solvents in which case selected portions of the image are removed by solvent action. Further, by use of a still different system of solvents, the image remaining after washoff of the unexposed surfaces may either be transferred to another surface so as to reverse the direction of reading, such transfer taking place readily, simply by soaking a second surface to which the image is to be transferred in a selected group of solvents; or, if desired, the treatment with such latter selected group of solvents may be sufficiently intense so as to remove the previous insoluble image completely for stripping purposes. Such photoresists may be produced at high rates of photographic speed and over broad spectral ranges of exposure. Selected spectral ranges of exposure may be utilized if desired. In portions of these compositions, the photographic speed is sufficient so that reflex techniques may be utilized for preparing the photoresist surface in question. While, in most cases, the images produced are colored, it is not a specific object of this invention to produce specifically a colored image, the principal and direct object being to produce an image which is insoluble in a selected solvent.

Specific amines useful for the purposes of my invention are listed in Table 1, and these are typical of the general classes of amines which are generally useful for my purposes, these general classes having been indicated above. Other amines in these same general classes are sufficiently chemically active for the purposes of my invention, but suffer from the disadvantage that they are liquids at room temperature. Such useful and active amines include: N-vinylpyrrolidone, ortho-toluidine, N-N-dimethylaniline, dibenzylamine, and N-methyldiphenylamine. These active amines which are normally liquid at room temperature can be utilized, if desired, by reducing or eliminating their volatility and liquid characteristic, e.g., by adsorbing them on a zeolite type molecular sieve.

TABLE 1

*Amines*[1] *Suitable for Preparation of Photoresists*

| COMPOUND |
|---|
| Diphenylamine |
| Benzidine |
| 4-4′-methylenedianiline |
| 1-napththylamine |
| Tribenzylamine |
| p-Toluidine |
| Diphenylguanidine |
| Indole |
| N-vinylcarbazole |

As indicated previously, the organic halogen-containing compounds which act as sources of free radicals on exposure to light are preferably taken from the group consisting of carbon tetraiodide, carbon tetrabromide, hexachloroethane, and tetrachlorotetrahydronaphthalene. For light sources which emit their radiation over a broad spectral range, mixtures of at least two of these compounds are utilized in which the amounts of free radical producers are roughly proportional to the amount of radiation in a specific area of wave length. As explained in my copending application Serial No. 22,703, filed concurrently herewith, these sources of free radicals may be used separately and judiciously for emphasizing sensitivity in particular spectral ranges, in that carbon tetraiodide exhibits peak sensitivity in the region of 5200 A. and covers a range of sensitivity from 4300 to 6100 A.; carbon tetrabromide exhibits peak sensitivity at about 3900 A. and exhibits a range of sensitivity between 4500 and 3000 A. and hexachloroethane and tetrachlorohydronaphthalene exhibit a peak sensitivity at about 3000 A. and are sensitive over a range of wave lengths between 3500 and 2500 A.

[1] Preferred species of representative genera.

The bases in which these active components are dispersed are generally comprised of mixtures of major amounts of hydrocarbons and minor amounts of synthetic resins. The utility of these bases for washoff purposes may be further enhanced by the addition of plasticizers.

The hydrocarbons comprising the base are solid paraffinic hydrocarbons generally designated by the formula $C_nH_{2n+2}$ wherein $n$ has a value between 20 and 70, and hence refers to hydrocarbons varying in molecular weight equivalent to a compound containing 20 carbon atoms up to a compound containing about 70 carbon atoms. These are taken from the class of normal, iso, and cyclic paraffins generally designated as paraffin waxes, microcrystalline waxes, and synthetic waxes. The synthetic resin materials utilized as additives to these hydrocarbons are preferably selected from polystyrene, polyethylene, and polybutene. Other synthetic resins such as polyvinyl acetate and polymethylmethacrylate are also useful but to a lesser extent than the first three listed and presumably polymers of other vinylidene monomers could also be used without departing from the intended scope of the invention.

Plasticizers useful for enhancing the washoff characteristics are taken from the group tricresylphosphate, liquid chlorinated biphenyls, dioctylphthalate, and the like. Equally as valuable are the oily or more or less liquid hydrocarbons such as petrolatum and mineral oil, these being semisolid or liquid materials containing hydrocarbons of molecular weights of less than about 266.

The preferred range of ratios of active amines to the free radical sources generally falls within a ratio of two parts by weight of the active amine to one part by weight of the organic halogen-containing compound which acts as the source of free radical to a ratio of one part of the organic amine to twenty parts of the organic halogen-containing compounds. If a total of five parts by weight of the combination of organic amine and halogen-containing compounds are utilized, a range of 0.5 part to five parts of a mixture of synthetic resin and hydrocarbon base may be utilized. This mixture consists of a major portion of hydrocarbon and a minor portion of a synthetic resin; a preferred ratio of hydrocarbon to synthetic resin varying between about one and ten parts of hydrocarbon for each part of resin, by weight. The preferred range of plasticizers will generally comprise between one and ten parts of these liquid or semisolid plasticizers per twenty parts of base by weight.

Usually all of the various ingredients of the photoresist composition are dissolved in a mutual solvent. Preferred solvents include straight hydrocarbons such as benzene, toluene, xylene, and cyclohexane. The concentration of active ingredients in such a solvent may vary from as low as 10% up to as high as 50%.

In the practice of my invention, this solution is spread on an appropriate substrate either under special lighting or in total darkness and is allowed to dry in the dark until the solvent has been completely eliminated. It is then exposed to light of appropriate wave length for suitable periods of time in order for the desired photochemical reaction to take place. In order to improve the washoff characteristics, the exposed image is heated by an infrared lamp at a distance of 4 to 10 inches for periods ranging from 30 seconds to one minute, under which circumstances temperatures of the order of 90 to 110° C. are achieved in the film. This heating step represents an improvement but is not required except for those amines containing an N-vinyl grouping. With N-vinylamines, the exposure to light must be followed by treatment with infrared in that the image representing potential insolubility develops out only as the result of application of heat.

After the appropriate treatment of light and heat, the film produced as the result of exposure to light is found to be insoluble in the solvents which maintain the ingredients in solution in the unexposed form. In addition, other solvents also show little or no effect on such films. Invariably, the unexposed portions remain fully soluble in solvents such as benzene, toluene, xylene, cyclohexane, ketones, tetrahydrofuran, chlorinated solvents, and are at least partially soluble in alcohols. After the exposure, the exposed portions of the films become insoluble in benzene, toluene, xylene, cyclohexane, chlorinated solvents such as carbon tetrachloride, chloroform, trichloroethylene, ethylene dichloride, and the insolubility in alcohol is enhanced over that originally exhibited. The exposed portions, however, are highly soluble in oxygen-containing solvents such as acetone, methylethyl ketone, and in tetrahydrofuran. This differentiation in solubility as the result of exposure provides a basis for all of the manipulations representing utility for photoresist combinations. In addition, both exposed and unexposed portions of the film are insoluble in water-containing solvents or in water itself and, as a matter of fact, the developed image is hydrophobic in character.

The light source used in defining the examples below was a 275 watt reflector type General Electric sunlamp utilized at a distance of 10 inches. The watts radiated from such a lamp at its surface totals approximately 15 over the range of 2500 to 7500 A., roughly one-third of this radiation being in the region of 3500 to 4500 A. Under these conditions for all compositions except those containing N-vinylamines, exposure times between 5 and 60 seconds are normally utilized with heat treatments between 30 seconds and 90 seconds under an infrared lamp of 275 watt input at distances of 4 to 6 inches. These exposure times are varied as the result of the nature of a source of free radicals and the times listed are those utilized when carbon tetrabromide is used as the source. When mixtures of the three types of organic halogen-containing sources of free radicals are utilized, exposure times of approximately half those indicated are suitable. In the case of the N-vinylamines, exposure times are one or more orders of magnitude less, being of the order of 1/10 to 1/100 those required for the other types of amines, and again improvements in speed can be obtained by using mixtures of free radical progenitors rather than any one of them singly in order to make best use of the radiated light of the particular lamp source utilized for the examples.

All of the amines with the exception of the N-vinylamines are negative working, the image being printed out directly as the result of exposure to light. In order to achieve positive results with such systems, negative copy is required. Use of an N-vinylamine, as described heretofore, makes possible the development of either a negative working or a positive working process as desired through suitable manipulation of the various light sources.

Substrates which may be utilized for these purposes comprise metals, glass, paper, cloth, inert plastic systems, and the like. Metals are generally used for photoetch, the preparation of printed circuits and for long run lithographic plates. In transferring a fully developed image from one surface to another, the original surface may be a polyester such as the commercially available Mylar, a polyester laminated on a metal base, a paper filled with a fully cured phenolformaldehyde, urea formaldehyde or melamine type resin, and the like. The base to which the image is transferred is generally hydrophyllic in nature either as a free surface or laminated on a metal surface such as aluminum foil. Such surfaces may comprise casein filled paper, gelatin filled paper, polyvinyl alcohol, methyl cellulose, and the like. Such surfaces are usually activated for transfer purposes by soaking or mopping or otherwise treating with a mixture of acetone and alcohol, wiping off such excess so that a minor portion of solvent remains, and then bringing such paper in contact with the developed image on the opposing surface.

The following examples are intended to further illustrate the nature of my invention and are not to be construed as limitative thereof.

EXAMPLE 1

The compositions listed in Table 2 were prepared under a red safelight and stored in brown bottles. The solvent used in each case was 99 cc. of benzene. The procedure followed in every instance was to first dissolve the synthetic resin in the benzene at room temperature. Generally between 10 and 20 minutes were required for this operation. The plasticizers, if used, were next added followed by the hydrocarbon. In general, the hydrocarbon dissolved very readily at room temperature except in the case of the high melting point waxes in which instance the solutions are slightly warmed in order to complete the dissolving action. The amine in the designated amounts is added next followed by the addition of the organic halogen-containing compound. After shaking, the bottle was capped and stored until ready for use.

TABLE 2

*Formulations for Photoresist*

[All parts are by weight]

| No. | Amine | Free Radical Source [1] | Synthetic Resin [2] | Hydrocarbon and/or Plasticizer | Exposure Time, Seconds |
|---|---|---|---|---|---|
| 1 | N-vinylcarbazole 10 | 5 | 0.5 | Eicosane 8 | 3 |
| 2 | do | 10 | 0.5 | do | 2 |
| 3 | N-vinylcarbazole 5 | 10 | 0.5 | do | 1 |
| 4 | N-vinylcarbazole 3 | 15 | 0.5 | do | 1 |
| 5 | N-vinylcarbazole 10 | 10 | 0.5 | Eicosane 1 | 10 |
| 6 | do | 10 | 1.0 | | 30 |
| 7 | do | 10 | 1.0 | Eicosane 2 | 15 |
| 8 | do | 10 | 1.0 | Ficosane 6 | 2 |
| 9 | do | 10 | 1.0 | Eicosane 10 | 1 |
| 10 | do | 10 | 1.0 | Eicosane 20 | 0.5 |
| 11 | do | 10 | 5.0 | | 40 |
| 12 | do | 10 | 5.0 | Eicosane 3 | 15 |
| 13 | do | 10 | 5.0 | Eicosane 5 | 5 |
| 14 | do | 10 | | Eicosane 10 | 0.5 |
| 15 | do | 10 | | {Petrolatum 4 / Hexahexacontane 6} | 1.0 |
| 16 | do | 10 | 5.0 | Tricresylphosphate 2 | 25 |
| 17 | do | 10 | 5.0 | Dioctylphthalate 2 | 20 |
| 18 | do | 10 | 1.0 | Tricresylphosphate 1 | 15 |
| 19 | Indole 10 | 10 | 1.0 | Eicosane 10 | 20 |
| 20 | Diphenylamine 10 | 10 | 1.0 | do | 30 |
| 21 | do | 20 | 1.0 | Eicosane 20 | 10 |
| 22 | Benzidine 10 | 10 | 1.0 | Eicosane 10 | 40 |
| 23 | 4-4′ methylene-dianiline 10 | 10 | 1.0 | do | 40 |

See footnotes at end of table.

TABLE 2—Continued

| No. | Amine | Free Radical Source [1] | Synthetic Resin [2] | Hydrocarbon and/or Plasticizer | Exposure Time, Seconds |
|---|---|---|---|---|---|
| 24 | 1-naphthylamine 10 | 10 | 1.0 | Eicosane 10 | 40 |
| 25 | Tribenzylamine 10 | 10 | 1.0 | do | 40 |
| 26 | N-vinylcarbazole 10 | 10 | 1.0 | 170° F. wax 10 | 10 |
| 27 | Indole 10 | 10 | 1.0 | 225° F. wax 10 | 25 |
| 28 | Diphenylamine 10 | 10 | 1.0 | 125° F. wax 6 | 25 |
| 29 | N-vinylcarbazole 10 | 10 | 1.0 | {225° F. wax 6<br>{Eicosane 6 | 5 |
| 30 | do | 10 | 1.0 | {175° F. wax 8<br>{Petrolatum 2 | 3 |
| 31 | Indole 10 | 10 | 1.0 | {225° F. wax 8<br>{Petrolatum 2 | 20 |
| 32 | Diphenylamine 10 | 10 | 1.0 | Eicosane 10 | 15 |
| 33 | do | 10 | 1.0 | do | 15 |
| 34 | N-vinylcarbazole 10 | 10 | 1.0 | do | 0.5 |
| 35 | do | 10 | 1.0 | do | 0.5 |
| 36 | do | 12 | 1.0 | do | 0.2 |
| 37 | do | 10 | 1.0 | {175° F. wax 8<br>{Petrolatum 2 | 3.0 |

[1] Free radical source is $CBr_4$ for compositions 1-35 inclusive; composition 36 is equal parts by weight of $CBr_4$, $CI_4$ and $C_2Cl_6$ and free radical source is $CI_4$ for composition 37.

[2] Polystyrene in compositions 1–13, 16–31, 36 and 37; polyethylene in compositions 32 and 34; polybutene in compositions 33 and 35.

Each of the solutions was then spread separately on a glass plate of thickness so that after evaporation of the solvent a film thickness of the order of 1 to 2 mils was obtained. This spreading was also carried out under a red safelight and the elimination of the solvent was permitted to take place in total darkness. The drying time required was usually of the order of 10 to 15 minutes. After the solvent had evaporated, a portion of the spread surface was blanked off with an opaque shield and the surface was then exposed to a 275 watt General Electric sunlamp type RS at a distance of 6 inches for the time in seconds indicated in the last column in Table 2. Immediately after exposure, the mask was removed and the entire surface was then exposed to a 175 watt reflector infrared lamp with red glass filter at a distance of 6 inches for 60 seconds. The ultraviolet exposed, infrared heat-treated surfaces were then dipped in benzene for 30 seconds, followed by a wash in clean benzene and allowed to dry. In each case, the portion of the film which had been previously exposed to the sunlamp was found to be insoluble (or exhibit an insoluble residue) in the benzene and such insoluble residue adhered tightly to the glass surface, whereas the portions of the film which had not been exposed to the sunlamp were soluble and washed off completely in the benzene treatment.

Though the property of color formation is not considered of principal importance to this invention, it is of interest to note the range of colors which were obtained as a result of the foregoing. In the case of the N-vinylcarbazole, the resultant colors were generally brown or brownish black. In the case of indole, the color was various shades of red; diphenylamine produced a deep blue; benzidine, a green brown; 4-4′-methylenedianiline, a muddy yellow; 1-naphthylamine, a brownish violet; tribenzylamine, a pale green; generally the colors obtained become deeper in hue tending more towards the brownish or blackish ranges as the duration of the infrared treatment was extended.

EXAMPLE 2

Composition No. 3 of Table 2 was prepared and placed on a glass plate as before. This was again exposed to the sequence of ultraviolet and infrared as detailed in Example 1. The washoff solution used in this example was carbon tetrachloride. The portions which had not been exposed to ultraviolet light were quickly and readily soluble in the carbon tetrachloride whereas the portions exposed to the ultraviolet light left insoluble residues which adhered tenaciously to the glass plate. After the carbon tetrachloride was evaporated, the glass plate with its developed image was dipped in water and it was found that the organic residue yielding the image was hydrophobic in character whereas the glass plate surface was wet by the water.

EXAMPLE 3

Again in benzene solution, the composition in accordance with Formula 3 of Table 2 was coated on a composite of copper foil laminated on a phenolformaldehyde glass fiber base of the type commonly used in the preparation of printed circuits. After the solvent had evaporated, exposure was made to the sunlamp at a distance of 6 inches for the time indicated in the table. The negative was removed and the assembly exposed to the infrared lamp as before for 45 seconds, after which it was dipped in benzene for 20 seconds followed by a wash of benzene for 2 seconds and was then allowed to dry. A solution comprising 25 parts by weight of ferric chloride in 100 parts of water plus 25 parts by weight of 32% hydrochloric acid was made up and the laminate containing its developed image was then dipped in such a solution. Etching proceeded rapidly and the copper in the exposed regions was etched away in about 2 minutes to yield bare plastic. The assembly was then washed in running water and the surface was rubbed with a sponge which had been previously soaked in acetone, removing all traces of the resist. The copper underneath the ultraviolet exposed areas of the resist was unaffected and a positive rendition of the negative in copper on the surface of the plastic was obtained.

In a modification of the etching procedure, ammoniacal ammonium persulfate solution at a concentration of 20 grams of ammonium persulfate per 100 grams of solution plus 15 cc. of ammonia water per 100 cc. of solution was used as the etchant at room temperature. In this case, the copper in the exposed areas was removed in approximately one minute and again the exposed and developed resist areas remained unaffected by the etchant.

EXAMPLE 4

The same procedure as described in Example 3 was followed except that composition No. 19 of Table 2 dissolved in benzene was utilized with the exposure time indicated in the table. In this case, the acid ferric chloride etchant was found to be fully effective.

EXAMPLE 5

A casein filled paper of the type normally used to produce a lithographic master in the typewriter was coated in the composition No. 20 of Table 2 again from a benzene solution and in accordance with the restrictions of Example 1 and utilizing the exposure time indicated in Table 2. After development with benzene as heretofore described, a bluish black image was retained in the ultraviolet exposed areas. The dried and cleaned sheet was utilized as a master on office type lithographic offset machine and was found to give good duplication from the diphenylamine developed image, establishing that the benzene insoluble residue is ink receptive and hydrophobic.

EXAMPLE 6

A sheet of aluminum foil was oxidized superficially by heating in air for 30 minutes at 450° C. The original bright reflecting surface became grayish white and dull as a result. A benzene solution of composition No. 14 of Table 2 was used as the coating material on the oxidized aluminum surface and the coated material thus obtained was exposed to the sunlamp for the time indicated in the table. After heat development and washing in benzene, the image remaining was again found to operate as a lithographic master.

EXAMPLE 7

A benzene solution of composition No. 37 of Table 2 was coated on a gelatin surfaced paper utilizing the techniques defined in Example 1. This coated sheet was then exposed by reflex techniques to a printed page utilizing black type, type side up. The light source in this case was a quartz envelope mercury fluorescent type having a total input capacity in the bank of 30 watts, this being equivalent to approximately 5 to 6 watts of radiated energy at the 2536 A. level. The exposure was made for a period of 5 seconds through a Corning Glass filter 7–54. The sheet was then removed from the printing frame and given a blanket exposure of 5 seconds to the 275 watt sunlamp described in Example 1 through a Corning Glass filter 0–52 and was thereafter developed with benzene as before. In this case, the areas corresponding to the white areas of the paper are still soluble in the benzene and are white in color, whereas the areas which have not been exposed to the far ultraviolet but only to the near ultraviolet were brown black in color and were insoluble in benzene.

A sheet of casein filled paper was sponged with acetone until the surface appeared to be just damp with acetone. The acetone sponged surface was then brought into contact with the developed image made by reflex techniques by passing through a roller, and it was found that the image had then transferred itself to the casein backed paper, but reading in the reverse direction. On swabbing with lithographic ink containing minor amounts of water, the developed and transferred image was found to be ink receptive and hydrophobic while the non-image areas were ink repellant and hydrophilic.

EXAMPLE 8

Composition No. 36, Table 2, was laid down on a copper coated plastic surface as in Example 3 and exposed through a negative in accordance with the exposure time given in the table. After heating under the infrared lamp for 45 seconds, the image was developed with benzene as before and etched with the acid ferric chloride solution. After washing in water, the residual resist was removed with acetone. A clear, sharp image of copper remained on the plastic in the areas exposed to the sunlamp.

Having now described the invention in accordance with the patent statutes, I claim:

1. A method for the preparation of photoresists which comprises: preparing a solution in a hydrocarbon solvent by dissolving therein at least one arylamine, at least one organic halogen-containing compound selected from the group of halogen substituted hydrocarbons which have an energy of formation of the free halogen radical of not less than about 40 kilogram calories per mol and which on exposure to light of a suitable wavelength generate a halogen containing free radical, and at least one carrier in which said arylamine and said halogen-containing hydrocarbon are dispersed, said carrier being selected from the group consisting of straight and branched chain paraffin and isoparaffin hydrocarbon waxes represented by the general formula $C_nH_{2n+2}$ wherein $n$ represents an integer between about 10 and 70 and mixtures of said waxes with polymers of vinylidene monomers, and a plasticizer for said hydrocarbon wax; the relative amounts of said solutes in said solution being such that there are between .05 and 2 parts by weight of amine for each part by weight of organic halogen compound which is a free radical source, and between 0.1 and 4 parts by weight total of hydrocarbon wax and polymer of vinylidene monomer for each part by weight of amine plus organic halogen compound and up to 10 parts by weight of a plasticizer for said hydrocarbon wax for each 20 parts by weight total of hydrocarbon wax and polymer of vinylidene monomer; applying a layer of said solution to a solid substrate; eliminating the solvent from said solution, thereby producing a film of the solutes on said support; exposing a portion of said film to radiant energy for shorter interval than about 60 seconds, thereby producing a reaction product in said exposed areas which is insoluble in said original hydrocarbon solvent; and producing a resist by washing off the soluble unexposed portion of the film by applying a liquid hydrocarbon to said film.

2. The method of claim 1 including, after the exposure to radiant energy—a blanket exposure to infrared energy, for about one minute—before the wash-off step.

3. The method of claim 1 wherein the insoluble residue is transferred to a second surface by soaking the second surface in a solvent for the insoluble residue and stripping the insoluble residue from the first surface thereby transferring it to the second surface.

4. The method of claim 1 wherein the arylamine is a solid at room temperature.

5. The method of claim 1 wherein the arylamine is selected from the group consisting of diphenylamine, benzidine, 4,4′-methylenedianiline, 1-naphthylamine, tribenzylamine, p-toluidine, diphenylguanidine, indole, and N-vinylcarbazole.

6. The method of claim 1 wherein the halogen substituted hydrocarbon is a solid at room temperature.

7. The method of claim 6 wherein the organic halogen compound which is the free-radical source is selected from the group consisting of carbon tetraiodide, carbon tetrabromide, hexachloroethane, and tetrachlorotetrahydronaphthalene.

8. The process of claim 1 wherein the film remaining after elimination of the solvent is exposed for between 5 and 60 seconds to radiant energy having wave lengths between 2500 A. and 7500 A.

9. The process of claim 2 wherein the subsequent exposure is for between about 30 seconds and 90 seconds to energy from an infrared source.

10. The process of claim 1 wherein the solvent in which the original solution is formed is a hydrocarbon selected from the group consisting of benzene, toluene, xylene, and cyclohexane.

References Cited in the file of this patent

UNITED STATES PATENTS

| | | |
|---|---|---|
| 1,587,270 | Beebe et al. | June 1, 1926 |
| 1,587,272 | Beebe et al. | June 1, 1926 |
| 1,587,274 | Beebe et al. | June 1, 1926 |
| 1,721,034 | Ostromislensky | July 16, 1929 |
| 2,072,465 | Reepe et al. | Mar. 2, 1937 |
| 2,276,840 | Hanford et al. | Mar. 17, 1942 |
| 2,754,210 | Elliott | July 10, 1956 |
| 2,760,863 | Plambeck | Aug. 28, 1956 |